(12) United States Patent  
McAlexander, III

(10) Patent No.: US 7,989,906 B2  
(45) Date of Patent: Aug. 2, 2011

(54) BI-DIRECTIONAL RELEASED-BEAM SENSOR

(75) Inventor: Joseph Colby McAlexander, III, Murphy, TX (US)

(73) Assignee: STMicroelectronics, Inc., Coppell, TX (US)

( * ) Notice: Subject to any disclaimer, the term of this patent is extended or adjusted under 35 U.S.C. 154(b) by 823 days.

(21) Appl. No.: 11/562,331

(22) Filed: Nov. 21, 2006

(65) Prior Publication Data

US 2007/0075387 A1 Apr. 5, 2007

Related U.S. Application Data

(62) Division of application No. 11/024,192, filed on Dec. 28, 2004, now Pat. No. 7,179,674.

(51) Int. Cl.
*H01L 49/02* (2006.01)

(52) U.S. Cl. .................. 257/419; 257/E29.324

(58) Field of Classification Search .............. 257/415, 257/419, E29.324

See application file for complete search history.

(56) References Cited

U.S. PATENT DOCUMENTS

| | | | |
|---|---|---|---|
| 4,653,326 A | 3/1987 | Danel et al. | |
| 4,737,660 A * | 4/1988 | Allen et al. | 307/112 |
| 4,855,544 A * | 8/1989 | Glenn | 200/61.45 R |
| 4,882,933 A * | 11/1989 | Petersen et al. | 73/514.13 |
| 4,918,032 A * | 4/1990 | Jain et al. | 438/52 |
| 5,016,072 A | 5/1991 | Grieff | |
| 5,129,983 A | 7/1992 | Greiff | |
| 5,316,979 A | 5/1994 | MacDonald et al. | |
| 5,465,604 A | 11/1995 | Sherman | |
| 5,496,436 A | 3/1996 | Bernstein et al. | |
| 5,503,017 A | 4/1996 | Mizukoshi | |
| 5,561,248 A * | 10/1996 | Negoro | 73/514.32 |
| 5,610,335 A | 3/1997 | Shaw et al. | |
| 5,610,337 A | 3/1997 | Nelson | |
| 5,707,077 A | 1/1998 | Yokota et al. | |
| 5,846,849 A | 12/1998 | Shaw et al. | |
| 5,847,454 A | 12/1998 | Shaw et al. | |
| 5,889,311 A * | 3/1999 | Shinogi et al. | 257/417 |
| 5,894,144 A * | 4/1999 | Mori et al. | 257/254 |
| 5,917,226 A | 6/1999 | Chan et al. | |
| 5,936,159 A * | 8/1999 | Kano et al. | 73/514.36 |
| 6,008,138 A | 12/1999 | Laermer et al. | |
| 6,028,343 A | 2/2000 | Chan et al. | |

(Continued)

FOREIGN PATENT DOCUMENTS

EP 0937985 A1 8/1999

(Continued)

*Primary Examiner* — Allan R Wilson  
(74) *Attorney, Agent, or Firm* — David V. Carlson; Lisa K. Jorgenson

(57) ABSTRACT

An acceleration sensor includes a semiconductor substrate, a first layer formed on the substrate, a first aperture within the first layer, and a beam coupled at a first end to the substrate and suspended above the first layer for a portion of the length thereof. The beam includes a first boss coupled to a lower surface thereof and suspended within the first aperture, and a second boss coupled to an upper surface of the second end of the beam. A second layer is positioned on the first layer over the beam and includes a second aperture within which the second boss is suspended by the beam. Contact surfaces are positioned within the apertures such that acceleration of the substrate exceeding a selected threshold in either direction along a selected axis will cause the beam to flex counter to the direction of acceleration and make contact through one of the bosses with one of the contact surfaces.

31 Claims, 7 Drawing Sheets

U.S. PATENT DOCUMENTS

| | | |
|---|---|---|
| 6,058,778 A | 5/2000 | Chan et al. |
| 6,124,765 A | 9/2000 | Chan et al. |
| 6,171,879 B1 | 1/2001 | Chan et al. |
| 6,180,536 B1 | 1/2001 | Chong et al. |
| 6,218,209 B1 | 4/2001 | Chan et al. |
| 6,235,550 B1 | 5/2001 | Chan et al. |
| 6,278,337 B1 | 8/2001 | Chan et al. |
| 6,316,796 B1 | 11/2001 | Petersen et al. |
| 6,389,899 B1 | 5/2002 | Partridge et al. |
| 6,401,535 B1 | 6/2002 | Foote |
| 6,410,361 B2 | 6/2002 | Dhuler et al. |
| 2003/0209075 A1 | 11/2003 | Okada |
| 2004/0097004 A1 | 5/2004 | Pogge et al. |
| 2007/0209437 A1 * | 9/2007 | Xue et al. .......... 73/514.31 |

FOREIGN PATENT DOCUMENTS

| | | | |
|---|---|---|---|
| JP | 11281665 A | * | 10/1999 |
| JP | 2004069652 A | * | 3/2004 |
| WO | 02/41006 | | 5/2002 |

* cited by examiner

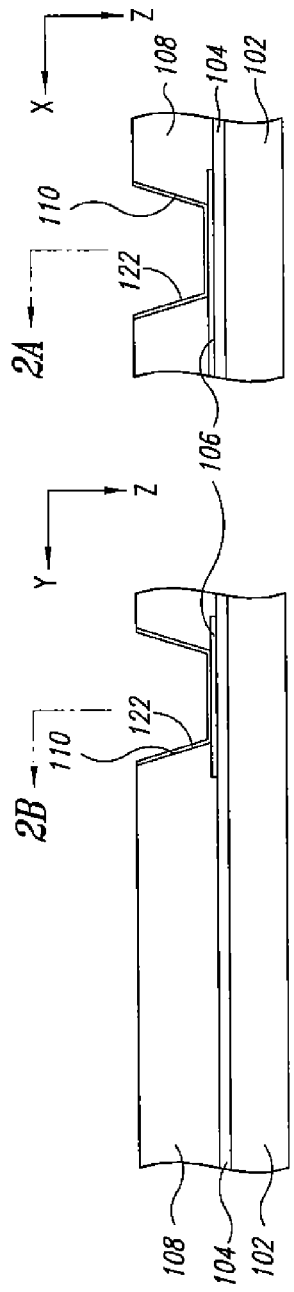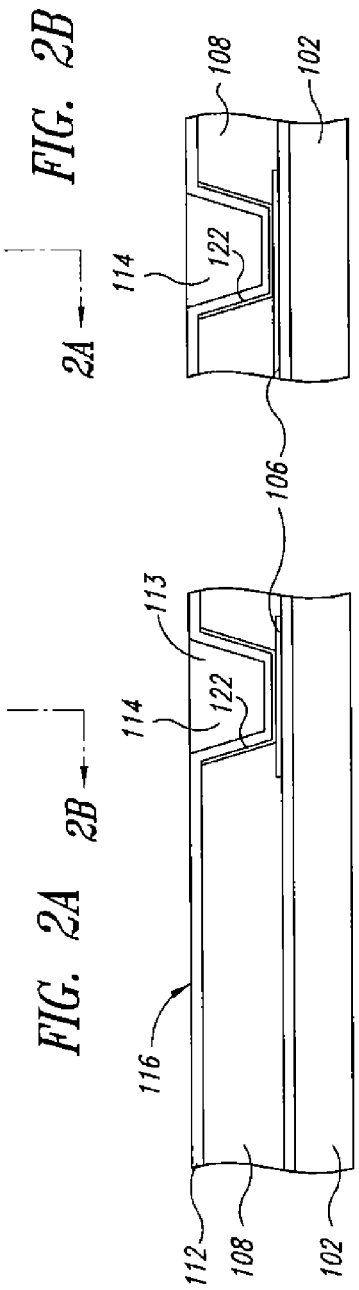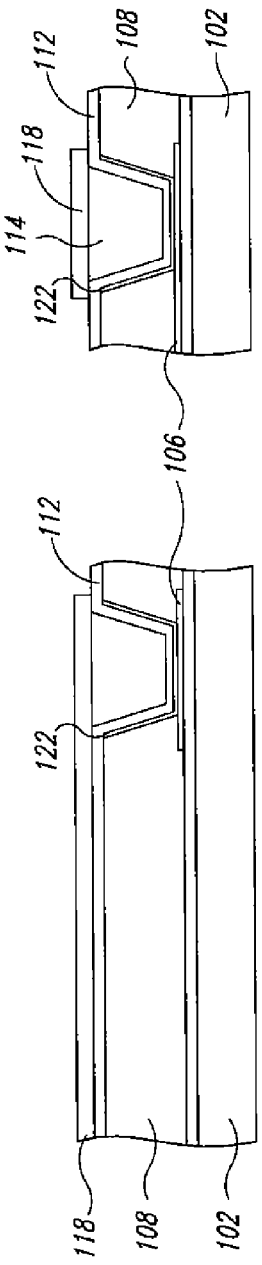

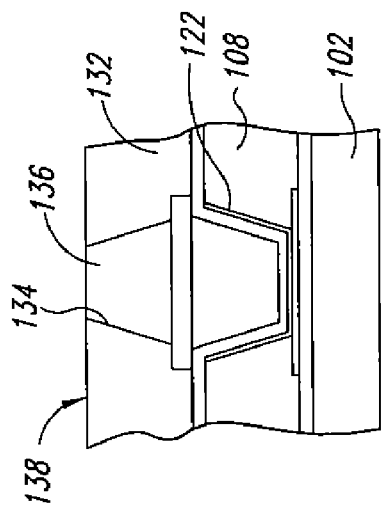
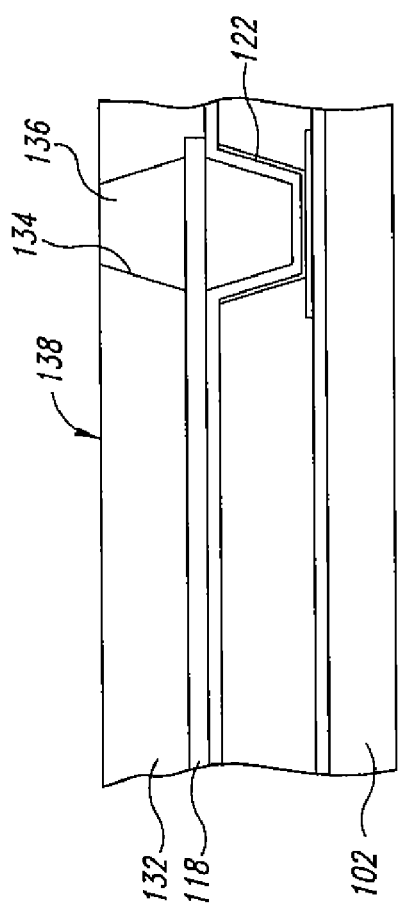
FIG. 5A
FIG. 5B
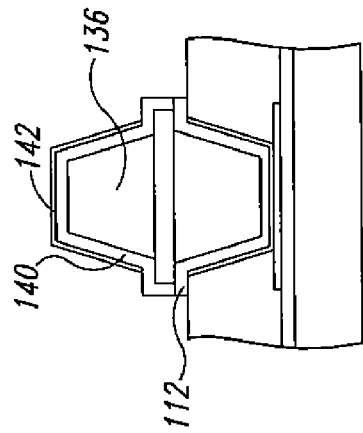
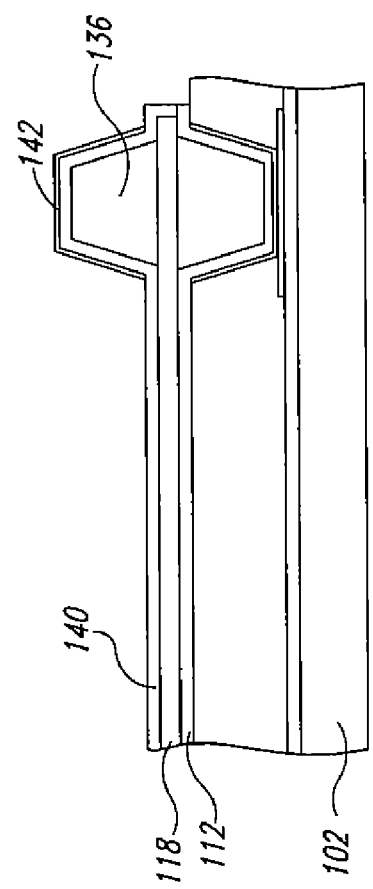
FIG. 6A
FIG. 6B

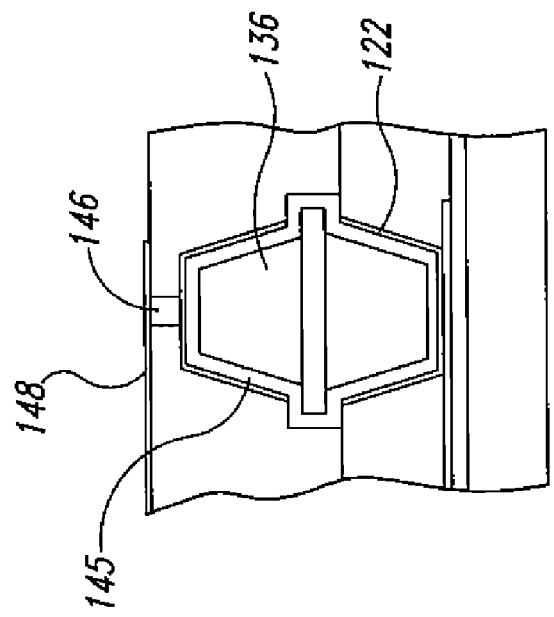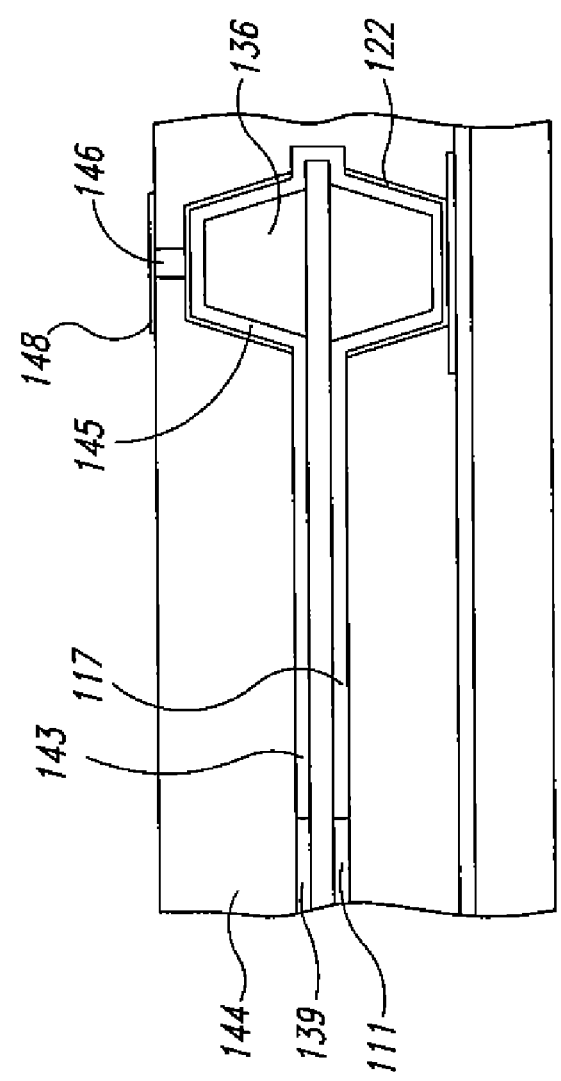

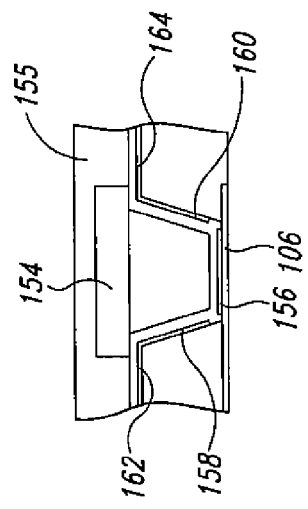
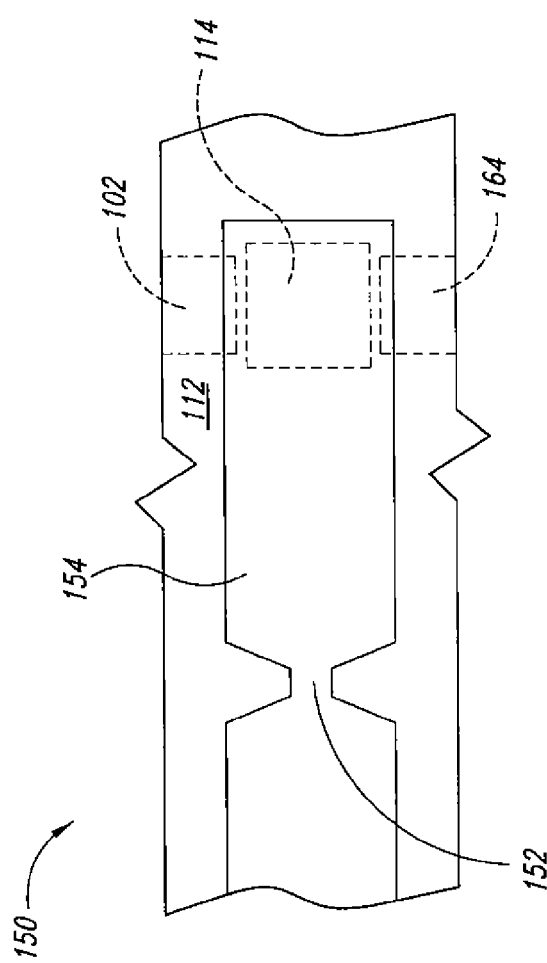
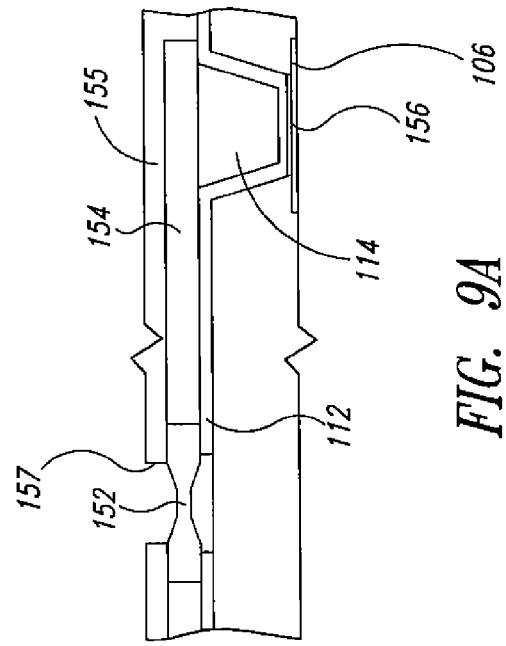

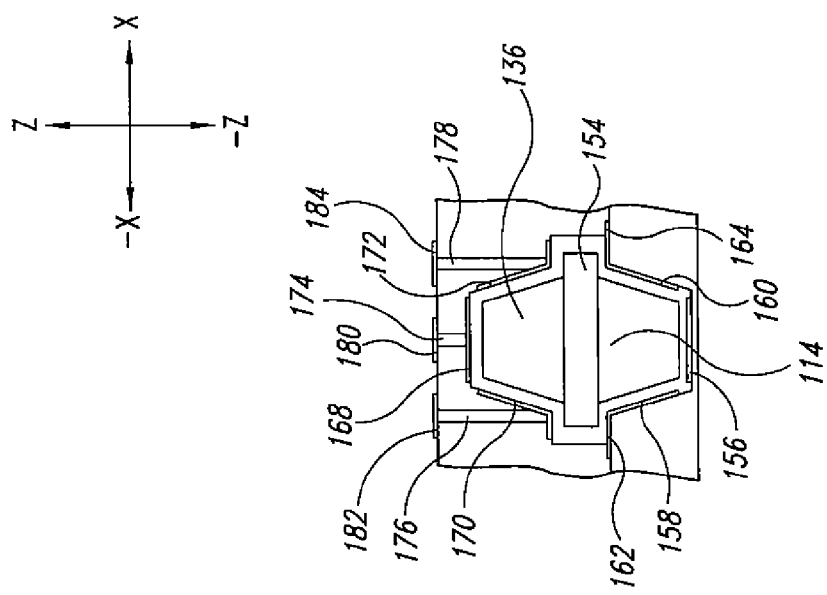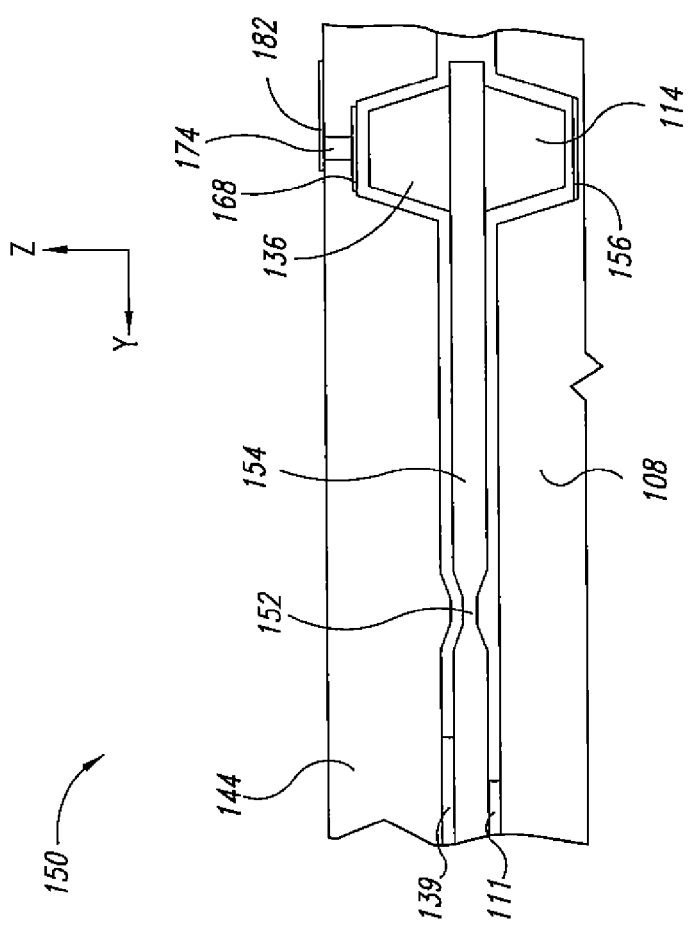
FIG. 10A
FIG. 10B

BI-DIRECTIONAL RELEASED-BEAM SENSOR

CROSS-REFERENCE TO RELATED APPLICATION

This application is a divisional of U.S. patent application Ser. No. 11/024,192, filed Dec. 28, 2004, now pending, which application is incorporated herein by reference in its entirety.

BACKGROUND OF THE INVENTION

1. Field of the Invention

The present disclosure relates generally to a semiconductor released-beam device, and in particular, to a bidirectional or multi-directional semiconductor released-beam device having a weighted beam.

2. Description of the Related Art

Micro-electromechanical systems (MEMS) in semiconductors have arisen for various applications to sense temperature, pressure, strain, acceleration, rotation, chemical properties of liquids and gases, etc. Those MEMS structures are usually combined with other integrated circuits, such as metal oxide semiconductor (MOS) circuits or complimentary metal oxide semiconductor (CMOS) circuits, for analyzing and calculating the parameters sensed by MEMS. Therefore, the MEMS manufacturing processes are required to be compatible with the existing MOS or CMOS manufacturing processes such that the whole system is inexpensive, reliable, and compact.

Different MEMS structures in semiconductors have been proposed and developed for such various sensing purposes. For example, a released-beam sensor was proposed in U.S. Pat. No. 5,917,226 for detecting temperature variation and an integrated released-beam oscillator was proposed in U.S. Pat. No. 6,278,337. A similar released-beam sensor was also proposed in U.S. Pat. No. 6,218,209 ('209 patent) for detecting acceleration and could be applied in airbag, anti-lock braking, or ride suspension systems for automobiles or in-flight aircraft monitoring systems.

BRIEF SUMMARY OF THE INVENTION

According to one embodiment of the invention, a bidirectional released-beam acceleration sensor is provided, comprising a semiconductor substrate, a first layer formed on a surface of the substrate, a first aperture within the first layer, and a beam coupled at a first end to the first layer and suspended above the first layer for a portion of the length thereof, a second end of the beam having a region positioned above the first aperture. The beam includes a first boss coupled to a lower surface thereof and suspended at least partially within the first aperture, and a second boss coupled to an upper surface of the second end of the beam. A second layer is positioned on the first layer over the beam and includes a second aperture within which the second boss is at least partially suspended.

Contact surfaces are provided within the apertures such that acceleration of the substrate in either direction along a selected axis will cause the beam to flex counter to the direction of acceleration and, provided the degree of acceleration exceeds a selected threshold, make contact through one of the bosses with one of the contact surfaces.

According to another embodiment, the beam is configured to respond to acceleration along a plurality of vectors lying in a plane perpendicular to a longitudinal axis of the beam. Additional contact surfaces are provided to detect and differentiate acceleration along different vectors or ranges of vectors lying in the plane.

Methods of manufacture and use are as described, according to embodiments of the invention.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale.

FIGS. 2A-7B illustrate various steps in the manufacture of a released-beam sensor, according to an embodiment of the invention, with all Figures A showing a side sectional view taken along lines A-A of FIG. 1, and all Figures B showing an end sectional view taken along lines B-B of FIG. 1.

FIG. 8 is a plan view of a released-beam sensor, according to another embodiment of the invention.

FIGS. 9A and 10A are side sectional views of the embodiment of FIG. 8 at different stages of manufacture.

FIGS. 9B and 10B are end sectional views of the embodiment of FIG. 8 corresponding to the manufacturing stages shown in FIGS. 9A and 10A, respectively.

DETAILED DESCRIPTION OF THE INVENTION

Released-beam sensors are described and claimed in copending applications Ser. No. 10/721,524 and Ser. No. 11/024,191, which are incorporated herein by reference, in their entirety.

In the following description, certain specific details are set forth in order to provide a thorough understanding of various embodiments of the invention. However, one skilled in the art will understand that the invention may be practiced without these details.

Figure 1:
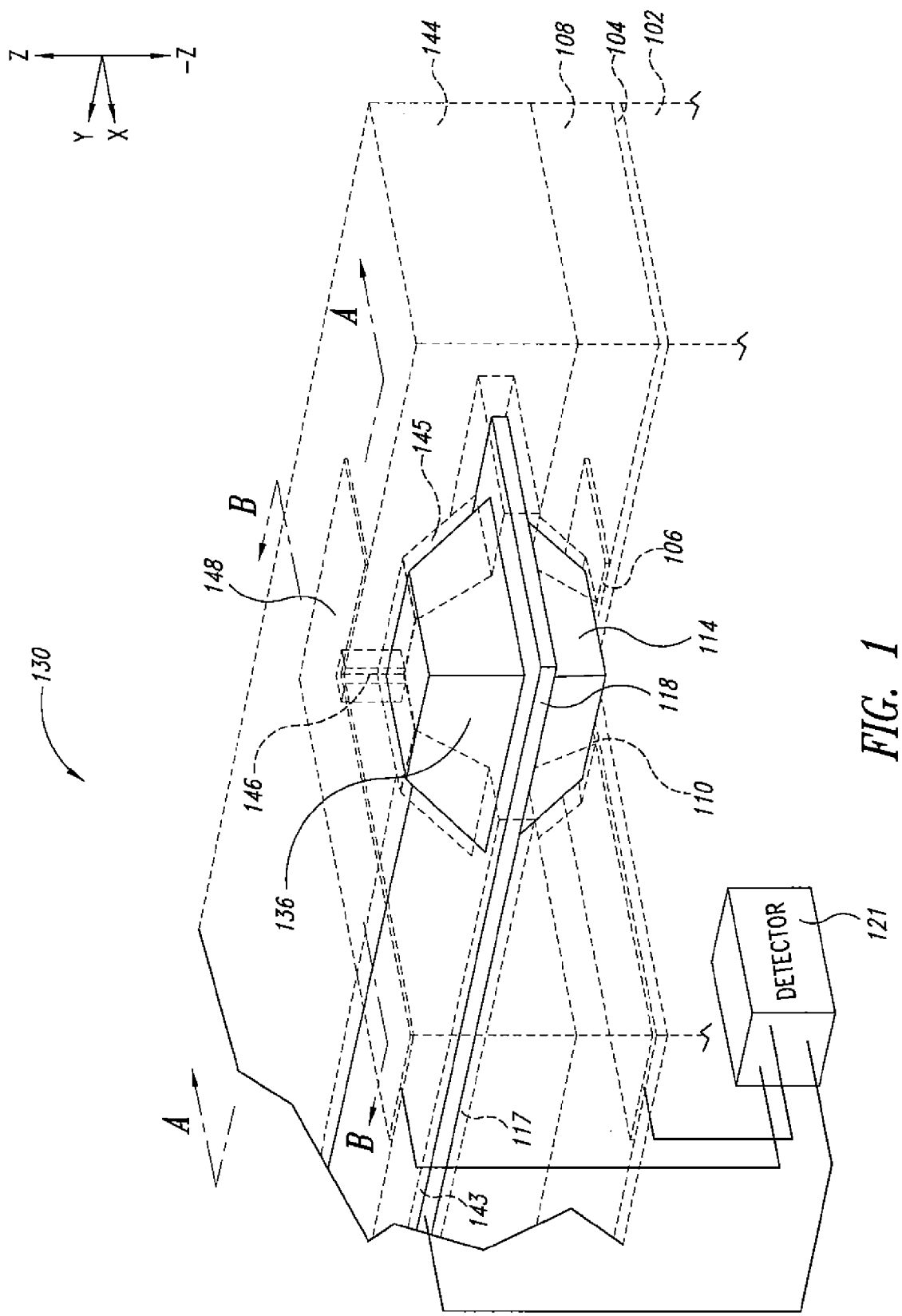
FIG. 1 is an isometric view of a released-beam sensor, according to an embodiment of the invention.

FIG. 1 illustrates a bidirectional released-beam sensor 130 according to a first embodiment of the invention. Sensor 130 is shown partially in phantom lines to disclose internal details. A portion of a semiconductor material substrate 102 is shown with layers 104, 108, and 144 positioned thereon. A conductive layer 106 is positioned between the layers 104 and 108, while conductive layer 148 is positioned above the layer 144.

The sensor 130 includes a beam 118 anchored at one end, such that the beam forms a cantilever lying in a plane substantially parallel to a surface of layer 108. A second end of the beam 118 extends above a cavity or aperture 110 formed in the layer 108. A first knob or boss 114 is coupled to the second end of the beam 118 on a lower surface thereof, and positioned to be suspended by the beam 118 within the aperture 110. A second boss 136 is coupled to an upper surface of the beam 118 opposite the first boss 114. A layer 144 is positioned over the layer 108, substantially encapsulating the beam 118 and bosses 114, 136. A portion of the beam 118 lies within an open space created by gaps 117 and 143. An upper aperture 145 is formed in the layer 144, with the boss 136 positioned therein. The apertures 110 and 145 are in communication with the gaps 117 and 143, respectively, such that the end of the beam 118 on which the bosses 114 and 136 are positioned is free to move, within the limits imposed by the apertures 110 and 145.

The term sidewall is used in this specification generally to refer to the inner surfaces of the apertures 110, 145, and may be interpreted to refer to any such surfaces, including those that, in the orientation shown in FIG. 1, appear at the bottom or top of the apertures 110, 145, respectively.

Conductive layers 122 and 142 are not shown in FIG. 1, but are shown in FIGS. 2A-7B. Conductive layer 122 is positioned on the sidewalls of the aperture 110 and in contact with conductive layer 106. Conductive layer 142 is coupled to the sidewalls of the upper aperture 145. A conductive via 146 electrically couples the conductive layer 142 with a conductive layer 148 positioned over the layer 144. The conductive layers 122, 142 provide contact surfaces for the bosses 114, 136, respectively, as described hereafter.

The beam 118 and bosses 114, 136 are made of any acceptable material that includes a conductive element. According to one embodiment, the beam 118 and bosses 114, 136 are conductive and formed of a metal or semiconductor layer. In other embodiments, The beam and bosses are glass, undoped silicon, or other insulative material, with a conductive layer coupled thereto to provide an electrical connection from the bosses to the first end of the beam 118. Alternatively, the beam 118 may be formed of a material that is different from the material used to form the bosses 114, 136.

Dimensions of the beam 118, such as its length, width, and thickness, are selected according to the requirements of the particular application. In the embodiment of FIG. 1, it may seen that the width of the beam 118 is significantly greater than the thickness thereof. As a result, the beam 118 will be relatively susceptible to flexion in the z-axis, while resisting flexion in the x-axis. Accordingly, a sensor incorporating the beam 118 will be responsive to acceleration in the z-axis while being substantially insensitive to accelerations in the x- or y-axis. The degree of sensitivity in the z-axis is influenced by factors such as the dimensions of the beam 118, particularly the length and thickness, and the weight of the bosses 114, 136. Thus, by controlling these factors, the degree of sensitivity of the beam 118 may be selected.

According to one embodiment, the materials of the bosses 114, 136 and the beam 118 are electrically conductive, and are electrically coupled to a detector circuit 121. The conductive layers 106 and 148 are also electrically coupled to the detector circuit 121. The detector circuit 121 is configured to detect electrical contact between one of the bosses 114 or 136, and the respective conductive layer 122 or 142. Thus, if the semiconductor substrate 102 on which the sensor 130 is formed is subjected to an acceleration along the z-axis of sufficient magnitude, the beam 118 flexes until the boss 114 makes contact with the conductive layer 122, or the boss 136 makes contact with the conductive layer 142, depending upon the polarity of the acceleration, thereby closing an electrical circuit, which is detected by the detector circuit 121.

The detector circuit 121 is shown only diagrammatically in FIG. 1, and will not be described in detail, inasmuch as the design and manufacture of such circuits is well known in the art today and within the abilities of one of ordinary skill in the art. The detector circuit 121 may be formed on the substrate 102, or may be formed on another substrate, or otherwise located external to the substrate 102 and sensor 130, and electrically coupled thereto by conventional means.

As has been explained, the sensitivity of the sensor 130 may be selected by controlling such parameters as the dimensions of the bosses 114, the mass of the bosses 114, 136, and the degree of separation of the bosses from the conductive layers 122, 142. Establishing such parameters for a given application is within the skill of one of ordinary skill in the art.

Sensors of the type described with reference to FIG. 1 may be used in applications where single-axis, bidirectional sensitivity is desirable. For example, it may be important that a sensor configured to deploy a vehicle airbag in response to a collision do so only when the collision occurs along the axis for which that airbag is configured to provide protection. Thus, in the case of a sensor configured to deploy right and left side airbags of a vehicle, the sensor 130 would be mounted in the vehicle such that its z-axis is aligned perpendicular to the direction of travel of the vehicle. In the event of a collision, the substrate 102 will be accelerated sideways at the same rate as the rest of the vehicle. Meanwhile, the bosses 114, 136 will tend to lag along the z-axis, causing the beam 118 to flex upward or downward, as viewed in FIG. 1, depending on the direction, or polarity with respect to the z-axis, of the collision. If the degree of acceleration is high enough to cause the boss 114 or the boss 136 to come into contact with a respective contact surface, such as the conductive layers 122 or 142, the detection circuit will instantly trigger deployment of the appropriate airbag.

On the other hand, if the vehicle is subjected to a collision from another direction, such as from the front or rear, the sensor 130 will be substantially insensitive to such a collision, and will not trigger either of the side airbags.

Manufacture of the sensor 130 will now be described with reference to FIGS. 2A-7B. In each of FIGS. 2A-8B cross-sections A and B are provided, with sections A showing a view along lines A-A, and sections B showing a view along lines B-B, as seen in FIG. 1. Many of the process steps are not shown or discussed in detail, inasmuch they are well known in the art and will be clear to one having ordinary skill in the art, given the present description.

Referring first to FIGS. 2A and 2B, a first layer 104 is formed on an upper surface of the semiconductor material substrate 102. Conductive layer 106 is then formed, and patterned as necessary, over the first layer 104. A second layer 108 is then formed over the conductive layer 106 and first layer 104. An aperture 110 is formed in the second layer 108 such that a portion of the conductive layer 106 is exposed at the bottom of the aperture 110. The material of the conductive layer 106 and the formulation of the etching step employed to form the aperture 110 may be selected such that the conductive layer 106 acts as an etch stop in the formation of the aperture 110.

The first and second layers 104, 108 may be made of any suitable material or combination of materials. Appropriate materials may include doped or undoped silicon, any of various oxides, quartz, glass, or any other material having the necessary characteristics, as described herein. The first layer may be an undoped epitaxial silicon isolation layer, with the second layer being a doped epitaxial layer suitable for the formation of active components elsewhere in the layer. According to an embodiment, the first layer is omitted, and the second layer is formed directly on the semiconductor material substrate 102. In another embodiment, the conductive 106 layer is also omitted, and a highly doped conductive region is formed in the substrate 102, positioned directly beneath the aperture 110 as a contact surface. In the embodiment of FIGS. 2A-8B, the layers 104 and 108 are nonconductive, at least in the portions shown in the figures.

Referring now to FIGS. 3A and 3B, a sacrificial layer 112 is formed over the second layer 108 and within the aperture 110 to a selected thickness. A layer 113 is then formed over the surface of the sacrificial layer 112 to a thickness sufficient to completely fill the aperture 110, then planarized back until the upper surface 116 of the sacrificial layer 112 is exposed, leaving a mass of material within the aperture 110. The portion of the layer 113 remaining after the planarization forms the first boss 114 and may be conductive itself or have a conductive layer applied thereto.

Referring now to FIGS. 4A and 4B, a conductive layer 115 is formed and patterned over the sacrificial layer and the boss 114 to form the beam 118 of the sensor 130.

As shown in FIGS. 5A and 5B, a second sacrificial layer 132 is deposited to a thickness substantially equal to the thickness of the first boss 114. The layer 132 is masked and etched according to known methods to form an opening 134 substantially similar in shape to the boss 114. A layer of material is deposited to a thickness sufficient to fill the opening 134, and planarized back to the surface 138 of the sacrificial layer 132. The mass of material remaining in the opening 134 forms the second boss 136.

Referring now to FIGS. 6A and 6B, the second sacrificial layer 132 is removed, leaving the second boss 136 affixed to an upper surface of the beam 118. A third sacrificial layer 140 is next deposited over the beam 118 and boss 136 to a thickness substantially equal to that of sacrificial layer 112. The first and third sacrificial layers 112, 140 are then patterned. A conductive layer 142 is deposited over the sacrificial layer 140 and patterned such that it remains covering the second boss 136, with the sacrificial layer 140 positioned therebetween.

Turning now to FIGS. 7A and 7B, a layer 144 is formed over the sacrificial layer 140 and conductive layer 142. The sacrificial layers 112 and 140 are next removed from around the bosses 114, 136 and a portion of the beam 118 in accordance with known methods that may include the formation of openings (not shown) in the layer 144 for this purpose. The removal of the sacrificial layers 112, 140 is controlled such that portions 111, 139 of the layers 112, 140 remain between a first end of the beam 118 and the layers 108 and 144, respectively, anchoring the first end of the beam 118 to the substrate 102. With the removal of the sacrificial layers 112, 140, gaps 117, 143, and opening 145 are formed in the layer 144. A second end of the beam 118 cantilevers from the anchors provided by the portions 111, 139 of the sacrificial layers, and supports the bosses 114, 136 within the openings 110, 145, respectively.

A via 146 is formed in the layer 144 over the conductive layer 142 and a conductive layer 148 is deposited over the layer 144 and in electrical contact with the via 146 and conductive layer 142.

While the apertures 110, 145 and bosses 114, 136 are shown to have frusto-pyramidal shapes, these features may be formed to have any convenient or useful shape, including cylindrical, semi-spherical, and frusto-conical.

The layer 144 is shown as completely encapsulating the beam 118 and bosses 114, 136. According to an alternate embodiment, the layer 144 is patterned to partially cover the beam 118 and boss 136, and in another embodiment, only a small portion of layer 144, sufficient to support the conductive layer 142, is provided.

Released-beam sensors configured according to the principles of the present invention have several advantages over previously known sensors. For example, many previously known released-beam sensors are formed in a semiconductor material layer such as the second layer 108, and occupy the entire thickness of the layer. In contrast, the released-beam sensor 130 is formed above the second layer 108. Accordingly, other devices or structures may be formed in the layer 108 underneath the beam, thereby utilizing space that was heretofore unavailable. Another advantage is provided by the fact that the sensor 130 includes the bosses 114, 136 coupled to the beam 118. The additional mass of the bosses affixed thereto causes the beam 118 to flex to a greater degree than the beam alone, under an equal degree of acceleration, and thus increases the sensitivity of the sensor 130 for a given beam length.

Accordingly, for a given threshold of sensitivity, the beam 118 may be shorter than would otherwise be necessary without the bosses 114, 136 affixed thereto. Thus, less area of the semiconductor substrate 102 is occupied by the sensor 130. An additional advantage that the released-beam sensor 130 has over many inertial sensors is that the circuitry required for its use as an acceleration threshold sensor can be extremely simple, since all that is necessary is the detection of a closed circuit between the boss 114 and the conductive layer 122, or between the boss 136 and the conductive layer 142. In contrast, sensors that employ capacitive coupling devices require relatively complex circuitry to detect changes in capacitance, and the provision of reference values for comparison with a change in capacitive coupling caused by acceleration, to determine whether an acceleration threshold has been exceeded.

Nevertheless, in some applications, it may be desirable to detect capacitive coupling between the bosses 114, 136 and the respective conductive layers 122, 142, in place of, or in addition to, the detection of electrical contact. For example, by measuring changes in capacitive coupling, a range of acceleration can be detected, rather than a threshold, only. It will be recognized that a capacitive coupling will exist between the boss 114 and the lower conductive layer 122, and between the boss 136 and the upper conductive layer 142. Accordingly, if the detector circuit is configured to detect changes in capacitive coupling, the sensor 130 may be employed to measure or detect varying changes in acceleration along vectors lying in the active plane of the sensor. Such detector circuits are known in the art, and within the abilities of one of ordinary skill in the art.

Another embodiment of the invention will now be described with reference to FIGS. 8-10B. Referring first to FIG. 8, a plan view of a sensor 150 is shown during an intermediate manufacturing step corresponding to the step described with reference to FIGS. 4A and 4B of the previous embodiment. As previously described, the conductive layer 115 is patterned to form a beam. In the embodiment of FIG. 8, the layer 115 is patterned to form a beam 154, including a narrowed region 152. According to the embodiment of FIG. 8, the narrowed region 152 has a width substantially equal to the thickness, such that, in transverse section, the region 152 is square.

Referring now to FIGS. 9A and 9B, a masking layer 155 is deposited over the beam 154 and an opening 157 is formed therein, exposing the narrowed region 152. An etch is performed to remove the sacrificial layer 112 from underneath the narrowed region 152, and a second etch is then performed. The second etch further reduces the narrowed region 152 to a substantially cylindrical shape.

Another feature that distinguishes the present embodiment from previously described embodiments is also shown in FIGS. 9A and 9B. Following the deposition of the conductive layer 122, as described in a previous embodiment with reference to FIGS. 2A and 2B, the conductive layer 122 is patterned to form three lower contact surfaces 156, 158, 160, and first and second connection traces 162, 164. First contact surface 156 is in electrical contact with the conductive layer 106 as described previously, and second and third contact surfaces 158, 160 are electrically coupled to first and second connection traces 162, 164, respectively.

Referring now to FIGS. 10A and 10B, the sensor 150 is shown at a stage corresponding to the stage described with reference to FIGS. 7A and 7B of the previous embodiment. Referring, in particular, to FIG. 10B, it may be seen that the conductive layer 142 has been patterned to form first, second, and third upper contact surfaces 168, 170, 172. First, second, and third vias 174, 176, 178 provide electrical coupling between the first, second, and third upper contact surfaces and first, second, and third upper connection traces 180, 182, 184, respectively, formed over the layer 144. A detector circuit, not shown, is configured to detect electrical contact between the first and second bosses 114, 136, and any one or more of the respective lower and upper contact surfaces, 156, 158, 160, 168, 170, and 172 via the conductive layer 106 and connection traces 162, 164, 180, 182, 184, respectively. The design and manufacture of such detector circuits is well known in the art today and within the abilities of one of ordinary skill in the art. The detector circuit may be formed elsewhere on the substrate 102, or may be coupled to the sensor 150 according to known means.

In operation, it will be recognized that, unlike the beam 118 of FIGS. 1-7B, because of the cylindrically shaped narrowed region 152, the beam 154 may flex such that the bosses 114, 136 travel along any axis lying in a plane defined by the axes x and z. Accordingly, the sensor 130 is responsive to accelerations of the substrate in the plane defined by axes x and z, and insensitive to acceleration along the axis y. For the purposes of this description, the plane defined by the axes x and z will hereafter be referred to as the active plane of the sensor 130.

Referring, in particular, to FIG. 10B, it may be seen that, given the configuration of the present embodiment, the sensor 150 may be configured to detect acceleration exceeding a selected threshold along up to twelve vectors lying in the active plane. For example, if the substrate 102 is subjected to an acceleration having a minus z vector, the beam 154 will tend to flex such that the boss 136 makes contact with the contact surface 168. The detector circuit will interpret this condition as an acceleration vector lying directly on the minus z axis. However, if the acceleration vector also includes a small minus x component, the boss 136 will make contact with the first and third upper contact surfaces 168, 172. The detector circuit will interpret this combination of contacts as indicating an acceleration vector lying close to the minus z axis, but with a minus x component. In likewise manner, each individual contact, or combination of contacts of the bosses with the various contact surfaces indicates a different vector angle of acceleration. The exact range of vector angles corresponding to each contact or combination of contacts is a matter of design selection and is controlled by factors such as the shape and dimensions of the bosses, the location and dimension of the contact surfaces, the cross-sectional shape of the narrowed region 152, etc. The sensitivity of the sensor 130 may be selected by controlling such parameters as the diameter and length of the narrowed region 152, the length of the beam 154, the mass of the bosses 114, 136, and the degree of separation of the bosses from the respective upper and lower contact surfaces. Selection of the appropriate values for these and other parameters for a given application is within the skill of one of ordinary skill in the art.

Figure 11:
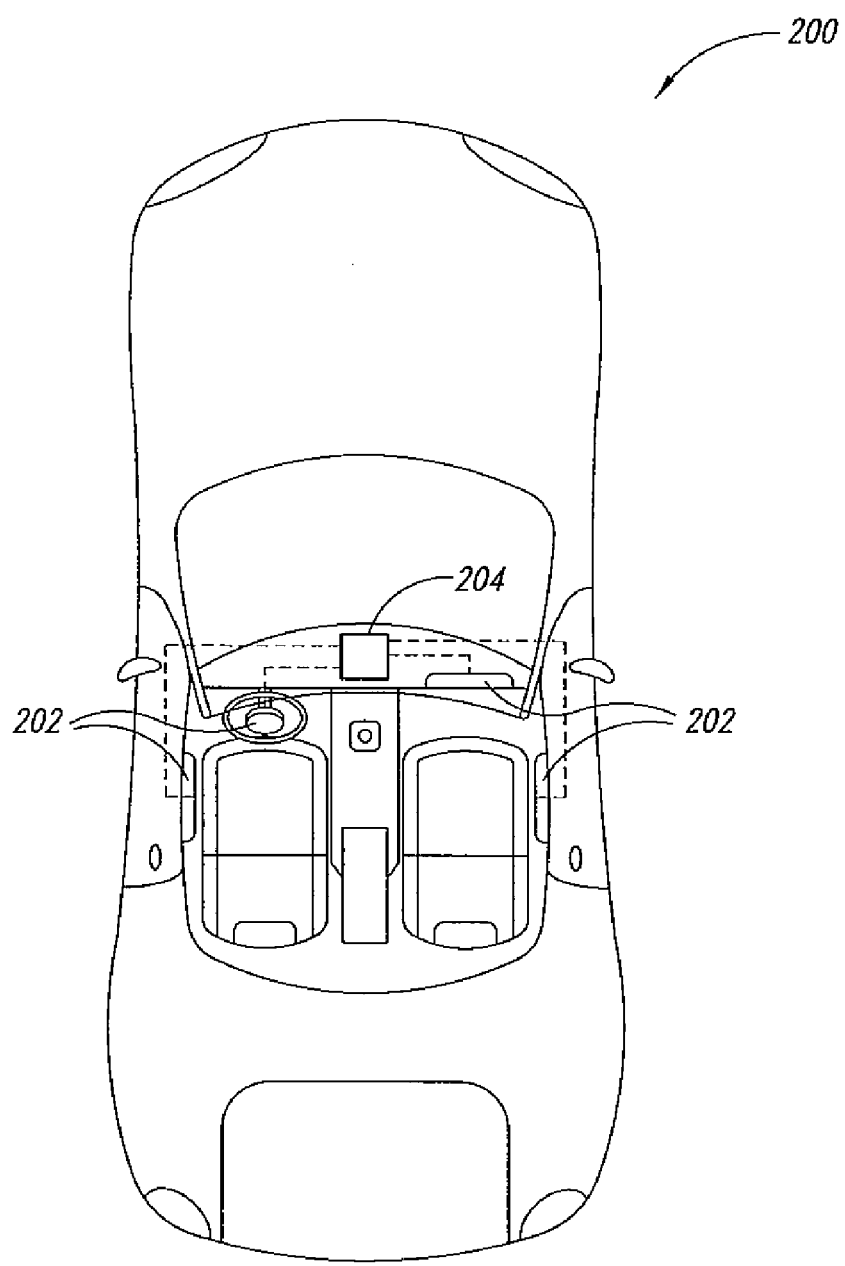
FIG. 11 shows a vehicle system according to an embodiment of the invention.

FIG. 11 shows a vehicle system 200 that includes a plurality of airbags 202 and a sensor 204. The sensor 204 is configured according to an embodiment of the invention and coupled to the airbags so as to activate one or more of the airbags in response to a collision of the vehicle that generates an acceleration along a selected axis, in which the acceleration exceeds a selected threshold.

While the released-beam sensor 130 has been described for use as an acceleration threshold sensor, it will be recognized that a capacitive coupling will also exist between the boss 114 and the lower contact surfaces 156, 158, 160, and between the boss 136 and the upper contact surfaces 168, 170, 172. Accordingly, if the detector circuit is configured to detect changes in capacitive coupling, the sensor 130 may be employed to measure or detect varying changes in acceleration along vectors lying in the active plane of the sensor.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A sensor, comprising:
   a semiconductor substrate;
   a first layer formed on a surface of the substrate;
   a first aperture within the first layer;
   a beam having first and second ends, the beam being mechanically coupled at the first end to the first layer and suspended above the first layer for at least a portion of the length of the beam and the second end having a region above the first aperture;
   a first boss coupled to a lower surface of the second end of the beam and suspended at least partially within the first aperture; and
   a second boss coupled to an upper surface of the second end of the beam.

2. The sensor of claim 1, further comprising a second layer positioned on the first layer and including a second aperture within which the second boss is at least partially suspended.

3. The sensor of claim 1 wherein the first layer is a dielectric layer.

4. The sensor of claim 1, further comprising a third layer positioned between the first layer and the semiconductor substrate.

5. The sensor of claim 1, further comprising a conductive layer positioned between the semiconductor substrate and the first layer with a portion thereof exposed within the first aperture.

6. The sensor of claim 1 wherein the beam and first and second bosses are electrically conductive.

7. The sensor of claim 2, further comprising a first contact surface positioned on at least one sidewall of the first aperture and a second contact surface positioned on at least one sidewall of the second aperture.

8. The sensor of claim 7 wherein the first contact surface is positioned on a first sidewall of the first aperture, the second contact surface is positioned on a first sidewall of the second aperture, and wherein the first and second contact surfaces are ones of a larger plurality of contact surfaces positioned on sidewalls of the first and second apertures.

9. The sensor of claim 8, further comprising a circuit electrically coupled to the first and second bosses and configured to detect electrical contact between any of the first and second bosses and any of the plurality of contact surfaces, according to a vector of acceleration of the substrate.

10. The sensor of claim 8, further comprising a circuit electrically coupled to the first and second bosses and configured to detect electrical contact between any of the first and second bosses and any one of the plurality of contact surfaces according to a vector of acceleration of the substrate, and also to detect electrical contact between any of the first and second bosses and any two adjacent ones of the plurality of contact surfaces, according to a vector of acceleration of the substrate.

11. The sensor of claim 8 further comprising a circuit configured to detect electrical contact between any of the first and second bosses and any of six contact surfaces, according to a vector of acceleration of the substrate.

12. The sensor of claim 8 wherein the first sidewall of the first aperture is a bottom wall of the first aperture, and the first sidewall of the second aperture is a bottom wall of the second aperture.

13. A sensor, comprising:
a semiconductor substrate;
a first layer formed on a surface of the substrate;
a first aperture within the first layer;
a second layer formed on the surface of the substrate and spaced apart from the first layer;
a second aperture within the second layer in a position opposite the first aperture;
a beam having first and second ends, the beam being mechanically coupled at the first end to the first layer and suspended between the first and second layers for at least a portion of the length thereof and the second end having a region between the first and second apertures;
a first boss coupled to a lower surface of the second end of the beam and suspended at least partially within the first aperture;
a second boss coupled to an upper surface of the second end of the beam and suspended at least partially within the second aperture; and
a first contact surface positioned on a first sidewall of the first aperture, a second contact surface positioned on a first sidewall of the second aperture, third and fourth contact surfaces positioned on second and third sidewalls of the first aperture, and fifth and sixth contact surfaces positioned on second and third sidewalls of the second aperture.

14. The sensor of claim 7, further comprising a circuit electrically coupled to the first and second bosses and configured to detect electrical contact between the first or second boss and the first or second contact surface, respectively.

15. A sensor, comprising:
a semiconductor substrate;
a first layer formed on a surface of the substrate;
a first aperture within the first layer;
a beam having first and second ends, the beam being mechanically coupled at the first end to the first layer and suspended above the first layer for at least a portion of the length thereof, and the second end having a region above the first aperture, the beam having a cylindrical shape along at least a portion of a length thereof;
a first boss coupled to a lower surface of the second end of the beam and suspended at least partially within the first aperture; and
a second boss coupled to an upper surface of the second end of the beam.

16. A sensor, comprising:
a semiconductor substrate;
a first layer of material formed on a surface of the substrate;
a beam having first and second ends, the beam being mechanically coupled at the first end to the first layer and suspended above the first layer such that the second end forms a cantilever above the first layer;
means for increasing a bi-directional sensitivity of the cantilever to acceleration of the substrate along a first axis; and
means for detecting response of the beam to acceleration bi-directionally along the one axis.

17. The sensor of claim 16 wherein the increasing means includes a first aperture formed in the first layer and first and second bosses coupled to the second end of the beam, the first boss suspended at least partially within the first aperture.

18. The sensor of claim 17 wherein the detecting means includes a second layer positioned above the first layer and including a second aperture within which the second boss is at least partially suspended.

19. The sensor of claim 16, comprising:
means for increasing a bi-directional sensitivity of the cantilever to acceleration of the substrate along at least a second axis lying in a plane defined by the first axis the plane lying perpendicular to a longitudinal axis of the beam; and
means for detecting response of the beam to acceleration bi-directionally along at least the second axis.

20. A system, comprising:
a vehicle having a motor, a drive train coupled to the motor, an axle coupled to the drive train, and wheels coupled to the axle for causing movement of the vehicle powered by the motor;
a passenger seat within said vehicle;
an airbag positioned adjacent to the passenger seat;
a sensor coupled to the airbag configured to cause inflation of the airbag, the sensor including:
a semiconductor material substrate,
a first layer above the semiconductor substrate,
a first aperture formed in the first layer,
a beam having first and second ends, the beam being mechanically coupled at the first end to the substrate and positioned above the first layer for a portion of a length of the beam to form a cantilever in a plane that is substantially parallel to an upper surface of the substrate, and
first and second bosses coupled to upper and lower surfaces, respectively, of the second end of the beam and suspended over the substrate, the first boss suspended at least partially within the aperture.

21. The system of claim 20, comprising a second layer over the first layer and having a second aperture positioned over the beam such that at least a portion of the second boss is suspended within the second aperture by the beam.

22. A method, comprising:
subjecting a semiconductor substrate to an acceleration;
moving a first boss coupled to an outer end of a cantilevered beam that is coupled at an inner end to the substrate, in response to the acceleration;
making electrical contact between the first boss and a contact surface on a sidewall of an aperture formed in a layer positioned between the cantilevered beam and the semiconductor substrate if the acceleration exceeds a selected threshold along a selected vector; and
sending a signal from the cantilevered beam to a sensing circuit only if the acceleration exceeds the selected threshold along the selected vector.

23. The method of claim 22 wherein the moving step includes flexing the cantilevered beam such that the first boss moves substantially parallel to the selected vector.

24. The method of claim 22, comprising deploying a vehicle airbag if the signal is sent.

25. The method of claim 22 wherein the making electrical contact step comprises making electrical contact if the acceleration exceeds the selected threshold along any vector lying in a plane perpendicular to a longitudinal axis of the cantilevered beam.

26. The method of claim 22 wherein the step of sending a signal comprises sending the signal from the cantilevered beam to the sensing circuit only if an absolute value of the acceleration exceeds the selected threshold along the selected vector.

27. The method of claim 22 wherein the making electrical contact step comprises making electrical contact if the acceleration exceeds the selected threshold along any of a plurality of selected vectors lying in a common plane.

28. The method of claim 22 wherein the making electrical contact step comprises making electrical contact if the acceleration exceeds the selected threshold along any of five selected vectors.

29. The method of claim 22 wherein the making electrical contact step comprises making electrical contact if the acceleration exceeds the selected threshold along any of twelve selected vectors.

30. A sensor, comprising:
a semiconductor substrate;
a first layer formed on a surface of the substrate;
a first aperture within the first layer;
a beam having first and second ends, the beam being mechanically coupled at the first end to the first layer and suspended above the first layer for at least a portion of the length of the beam and the second end having a region above the first aperture;
a boss coupled to a lower surface of the second end of the beam and suspended at least partially within the first aperture; and
a first contact surface, a second contact surface, and a third contact surface positioned, respectively, on first, second, and third sidewalls of the first aperture.

31. The sensor of claim 30 comprising a circuit electrically coupled to the boss to detect electrical contact between the boss and any of the first, second, and third contact surfaces.

* * * * *